United States Patent
Kramer

(12)
(10) Patent No.: US 6,182,239 B1
(45) Date of Patent: Jan. 30, 2001

(54) FAULT-TOLERANT CODES FOR MULTI-LEVEL MEMORIES

(75) Inventor: Alan Kramer, Berkeley, CA (US)

(73) Assignee: STMicroelectronics, Inc., Carrollton, TX (US)

(*) Notice: Under 35 U.S.C. 154(b), the term of this patent shall be extended for 0 days.

(21) Appl. No.: 09/020,064

(22) Filed: Feb. 6, 1998

(51) Int. Cl.$^7$ ........................................... H02H 3/05
(52) U.S. Cl. ....................................... 714/5; 714/52
(58) Field of Search ........................... 714/710, 711, 714/723, 5, 8, 54, 52; 365/200, 201

(56) References Cited

U.S. PATENT DOCUMENTS

| | | | |
|---|---|---|---|
| 3,633,175 | * 1/1972 | Harper | 340/172.5 |
| 3,772,652 | * 11/1973 | Hilberg | 340/172.5 |
| 4,047,163 | * 9/1977 | Choate et al. | 340/173 |
| 4,051,354 | * 9/1977 | Choate | 235/312 |
| 4,393,474 | * 7/1983 | McElroy | 365/200 |
| 4,547,882 | * 10/1985 | Tanner | 371/38 |
| 4,653,050 | * 3/1987 | Vaillancourt | 371/10 |
| 4,768,169 | * 8/1988 | Perlegos | 365/200 |
| 4,783,781 | * 11/1988 | Awaya | 371/10 |
| 5,097,447 | * 3/1992 | Ogawa et al. | 365/200 |
| 5,200,959 | * 4/1993 | Gross et al. | 714/723 |
| 5,268,870 | * 12/1993 | Harari | 365/218 |
| 5,379,415 | * 1/1995 | Papenberg et al. | 395/575 |
| 5,406,565 | * 4/1995 | MacDonald | 714/711 |
| 5,455,834 | * 10/1995 | Chang et al. | 371/40.1 |
| 5,473,753 | * 12/1995 | Wells et al. | 714/5 |
| 5,475,693 | * 12/1995 | Christopherson et al. | 371/10.2 |
| 5,530,393 | 6/1996 | Guerrieri et al. | 327/355 |
| 5,553,231 | * 9/1996 | Papenberg et al. | 714/5 |
| 5,559,956 | * 9/1996 | Sukegawa | 714/8 |
| 5,592,418 | 1/1997 | Sabatini et al. | 365/185.18 |
| 5,619,642 | * 4/1997 | Nielson et al. | 714/6 |
| 5,671,229 | * 9/1997 | Harari et al. | 714/710 |
| 5,740,349 | * 4/1998 | Hasbun et al. | 714/8 |
| 5,857,069 | * 1/1999 | Kohler | 714/5 |
| 5,954,828 | * 9/1999 | Lin | 714/630 |

OTHER PUBLICATIONS

"Flash–Based Programmable Nonlinear Capacitor for Switched–Capacitor Implementations of Neural Networks," *IEDM 94–449*, Dec. 1994, pp. 449–452.

"A 98mm$^2$ 3.3V 64Mb Flash Memory with FN–NOR Type 4–level Cell," *IEEE International Solid–State Circuits Conference*, ISSCC96 Paper TP 2.3, pp. 36–37, and 24–25.

"A 3.3V 128Mb Multi–Level NAND Flash Memory for Mass Storage Applications," *IEEE International Solid–State Circuits Conference*, ISSCC96 Paper 2.1, pp. 32–33 and 20–21.

"A Multi–level–Cell 32Mb Flash Memory," *IEEE International Solid–State Circuits Conference*, ISSCC95 Paper 7.7, pp. 132–133, 98–99 and 351.

"A 4–Level Storage 4Gb DRAM," *IEEE International Solid–State Circuits Conference*, ISSCC97 Paper 4.6, pp. 74–75.

"Novel Fingerprint Scanning Arrays Using Polysilicon TFT's on Glass and Polymer Substrates," *IEEE Electron Device Letters*, vol. 18, No. 1, Jan. 1997, pp. 19–20.

* cited by examiner

*Primary Examiner*—Joseph E. Palys
*Assistant Examiner*—Earl Gunderson
(74) *Attorney, Agent, or Firm*—Theodore E. Galanthay; Lisa K. Jorgenson; Andre Szuwalski

(57) ABSTRACT

A fault-tolerant code semiconductor memory storage device includes a array of individual multi-level storage devices arranged in a prescribed sequence. A controller is provided for programming the array with sequential data. The controller detects an occurrence of a faulty storage device in the array during a programming of the array with the sequential data. The controller further codes the occurrence of the faulty storage device in a subsequent storage device in the sequence of devices using a fault-tolerant code. A method of fault-tolerant coding of a semiconductor memory storage device is also disclosed.

30 Claims, 12 Drawing Sheets

FAULT-TOLERANT CODES FOR MULTI-LEVEL MEMORIES

BACKGROUND OF THE INVENTION

1. Field of the Invention

This invention relates generally to a semiconductor memory devices, and particularly, to a fault-tolerant method and apparatus for multi-level semiconductor memory arrays.

2. Discussion of the Related Art

Large memory arrays suffer from the problem that some devices in the array will be bad, i.e., faulty. As a result, those devices which are bad cannot be correctly programmed. An ability to tolerate faults in a memory array, corresponding to a fault tolerance, would be desirable. A classical solution for providing fault tolerance to such memory arrays has been to add repair columns and/or rows to the array. In other words, redundant columns and/or rows are included in the memory array. A row (or column) containing a bad device can be disabled and a repair row (or column) can be activated to "fill in" for the disabled row (or column). A disadvantage of the use of such a repair row (or repair column) is that each bad device results in an entire row (or column) of devices being disabled. In the case of large memories with a large number rows (e.g. 256) and a large number of columns (e.g. 256), the latter solution of fault tolerance becomes inefficient and expensive.

A multi-level memory array is similar in structure to a typical memory array for non-volatile storage, however, the multi-level memory array is able to store a higher density of data. Storing higher density is achieved by storing between 2 and 8 bits of data for a single memory device of the memory array (i.e., 2–8 bits per single memory cell). For 2-bits of data, $2^2$ or 4 levels of charge can be stored per device. For 4-bits of data, $2^4$ or 16 levels of charge can be stored per device. Alternatively, for an n-bit storage cell, where n is an integer, $2^n$ levels of charge can be stored per device.

With respect to multi-level and analog storage, the term multi-level storage refers to the storage, for example, of two bits (corresponding to four storage levels) per memory device in a memory array. Multi-level storage technology has been employed for both Flash-EEPROM, as well as DRAM. Multi-level storage for DRAM is discussed, for example, in the article entitled "A 4-Level Storage 4 Gb DRAM," Tatsunori Murotani et al., ISSCC97, paper TP 4.6, pages 74–75. Multi-level storage can reduce an effective cell size since it allows the storage of multiple voltage levels in a single memory cell functioning as a multi-bit memory. When four levels are stored in a single memory cell, the effective cell size is halved. With respect a multi-level storage DRAM, FIG. 1 illustrates the four-level storage concept (i.e., coding of a 2-bit memory and corresponding levels) in addition to conventional 2-level storage. With the four-level storage concept, a single memory cell stores four levels which corresponds to 2-bit data of "11", "10", "01", and "00". In conventional 2-level storage, the signal charge is one-half the maximum stored charge but in 4-level storage, the signal charge is one-sixth of the maximum stored charge.

Analog storage refers to the storage of more bits per device in a memory array, typically four to eight (4–8) bits (corresponding with 16-256 levels). Analog storage techniques have also been applied to both Flash-EEPROM, EEPROM, and specialized DRAM memories. With an analog flash memory, four to eight (4–8) bits of data can be stored on a single flash storage device, the storage device including, for example, a floating gate MOSFET. An example of a multi-level flash memory is described, for example, in the article "A Multilevel-Cell 32 Mb Flash Memory," M. Bauer et al., ISSCC95, paper TA 7.7, pages 132–133. A flash memory with multilevel cell significantly reduces the memory per-bit cost. For instance, a 32 Mb multilevel cell (MLC) Flash memory storing two bits of data per cell achieves 32 Mb memory storage capacity using 16M Flash memory cells. In MLC operation, the logical Flash memory cell achieves two bits per cell using four possible states, defined by four Flash cell threshold voltage ranges. The relationship between the threshold voltage ranges stored in the Flash memory cell and the corresponding logic levels is shown in FIG. 2. FIG. 2 illustrates a plot of four threshold voltage distributions (Vt), each with a separation range. The threshold voltages of read reference cells (R1, R2, and R3) are placed in the separation ranges between states. During read operations, read reference cells (not shown) are used in a binary search sensing scheme (BSSS). Threshold voltages of program verify reference cells (PV1, PV2, and PV3) are placed at the lower Vt edge of the various states. During program operations, the program verify cells are used to determine the lowest threshold voltage for states 2, 3 and 4. The maximum threshold voltage of state 0 (the erase state) is determined by the threshold voltage of an erase verify cell (EV) used during erase operations. Furthermore, programming of the memory cells to the various states is accomplished using an on-chip algorithm that applies a series of programming pulses to the Flash cell to adjust the threshold voltage by a predetermined amount. Typical threshold voltage distribution width for a state, shown in FIG. 2, is approximately 500 mV. After each program pulse, a program verify is performed by sensing the threshold voltage level of a cell using the BSSS with the program verify reference cells (PV1, PV2, and PV3) replacing the read reference cells (R1, R2, and R3).

In the article "A 3.3V 128 Mb Multi-Level NAND Flash Memory for Mass Storage Applications," Tae-Sung Jung et al., ISSCC96, Paper TP 2.1, pages 32–33, a 128 Mb multi-level NAND flash memory stores two bits per cell by tight programmed cell threshold voltage (Vth) control. Program states have 0.4V Vth distribution and a 0.8V separation gap. Incremental-step pulse programming (ISPP) gives narrower Vth distribution with a smaller stepping voltage. In addition, in the article "A 98 $mm^2$3.3V 64 Mb Flash Memory with FN-NOR Type 4-level Cell," Masayoshi Ohkawa et al., ISSCC96, paper TP2.3, pages 36–37, a 64 Mb flash memory with a multi-level cell and 64-memory-cell parallel programming is described. Drain-voltage controlled multilevel programming (DCMP) is used for simultaneous multi-level programming in the flash memory chip. To implement the DCMP, a parallel multi-level verify (PMV) circuit and the compact multi-level sense amplifier (CMS), which enable a 64-memory-cells parallel programming operation (program/program verify), are used. Additional discussion and details may be found in the cited articles, and thus not further discussed herein.

As discussed above, a prescribed number of levels, corresponding to bits of data, can be stored using a single flash storage device of an analog flash memory. Analog flash memory thus allows a significantly denser memory structure than that possible using conventional digital or multi-level memory techniques.

FIG. 3 illustrates a floating gate MOSFET device 10 having a source 12 and drain 14 region formed in a bulk silicon substrate 16. A channel region 18 extends between the source and drain regions. The floating gate MOSFET device 10 further includes a floating gate 20 and a control gate 22 positioned over the channel 18, separated from one another and the bulk silicon via an insulative layer (not shown). An electrical schematic of the floating gate MOSFET device is illustrated in FIG. 4. In addition, an exemplary electrical circuit 30 for use in reading a stored value from the floating gate MOSFET device using conductance is shown in FIG. 4. In the circuit 30 of FIG. 5, an analog-to-digital converter 32 converts an analog value into an appropriate digital value corresponding to the value stored in the floating gate device 34. Circuit 30 further includes an op-amp 36 and a current source 38. Floating gate MOSFET storage devices are known in the art and thus only briefly discussed herein.

Still further, the use of floating gate technology for long-term analog storage is known in the art, for example, as discussed in "Flash-Based Programmable Nonlinear Capacitor for Switched-Capacitor Implementations of Neural Networks," A. Kramer et al., IEDM 94–449, pages 449–452. In addition, an example of an electrically erasable nonvolatile memory cell (FLASH EEPROM) designed for use in analog computing devices in the charge domain is disclosed in U.S. Pat. No. 5,592,418, assigned to the assignee of the present invention, incorporated herein by reference.

In view of prior methods as discussed above for providing fault tolerance to memory arrays, it would thus be desirable to provide an improved method and apparatus for handling defective devices of a memory array, especially with respect to a sequential access array.

SUMMARY OF THE INVENTION

It is an object of the present invention to provide an improved mechanism for fault-tolerance in multi-level serial access memories based on the use of fault tolerant coding.

In accordance with the present invention, a fault-tolerant code semiconductor memory storage device includes a array of individual multi-level storage devices arranged in a prescribed sequence. A controller is provided for programming the array with sequential data. The controller detects an occurrence of a faulty storage device in the array during a programming of the array with the sequential data. The controller further codes the occurrence of the faulty storage device in a subsequent storage device in the sequence of devices using a fault-tolerant code.

In accordance with another embodiment of the present invention, a method of fault-tolerant coding of a semiconductor memory storage device includes the steps of providing a array of individual multi-level storage devices arranged in a prescribed sequence, programming the array with sequential data, detecting an occurrence of a faulty storage device in the array during a programming of the array with the sequential data, and coding the occurrence of the faulty storage device in a subsequent storage device in the sequence of devices using a fault-tolerant code.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figures 1, 2:
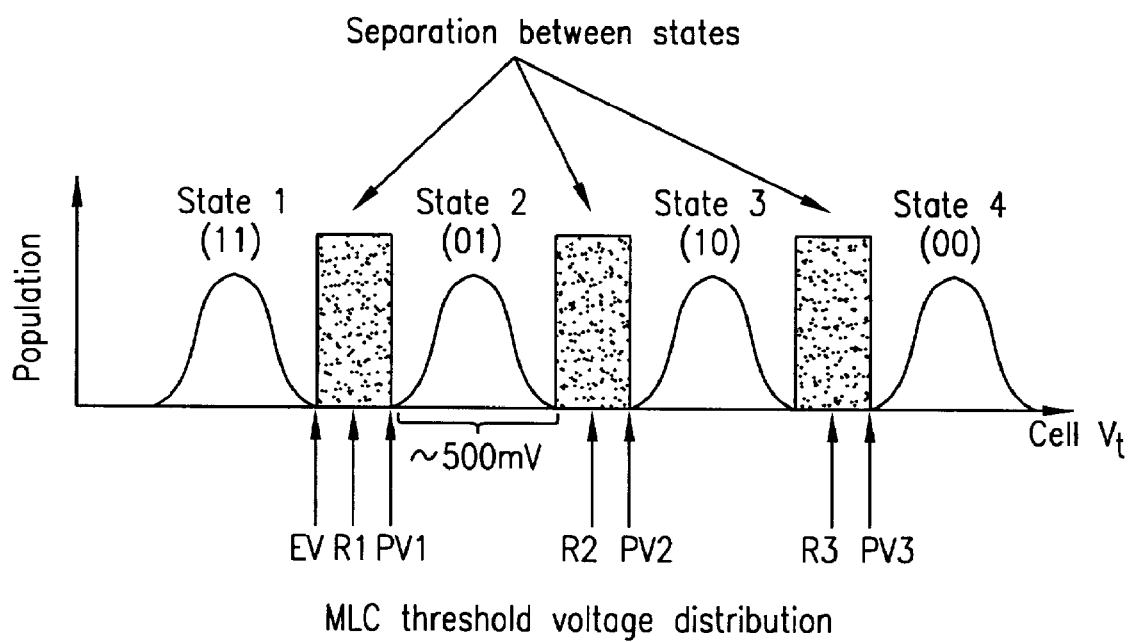
FIG. 1 illustrates an exemplary 4-level storage (2 bit) and 2-level storage for a memory cell.
FIG. 2 illustrates an exemplary multi-level cell threshold voltage distribution.
Figure 3:
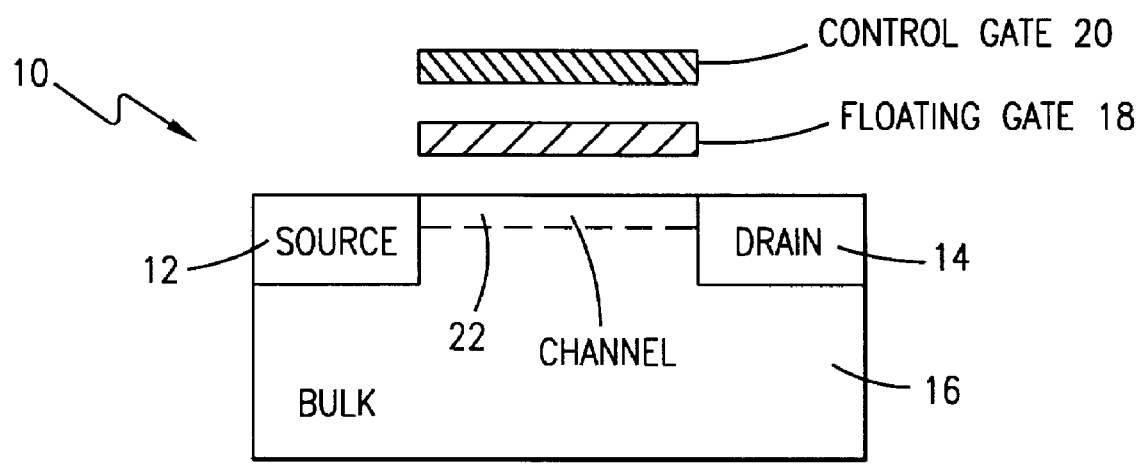
FIG. 3 illustrates a floating gate MOSFET device.
Figure 4:
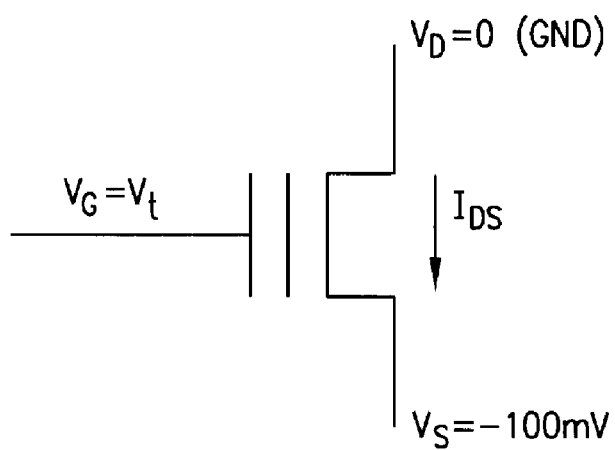
FIG. 4 illustrates an electrical schematic of a floating gate MOSFET device.

According to the present invention, a fault tolerant coding technique uses a multi-level memory for advantageously implementing device at-a-time redundancy in a sequential memory array. Given a particular redundancy code, and given that the memory array is read in a sequential manner, then a single memory cell in the sequence of memory cells, which occurs after a defective or faulty device, is used to code the fact that the previous device was determined faulty. Thus, the overhead for a faulty device is one device instead of an entire row (or column) of devices.

A number of different faults may occur, corresponding to a number of different failure mechanisms. A faulty device is a device whose state before or after programming cannot be guaranteed. Such a state of a faulty device may fluctuate randomly also. Thus, if the statistics of the faults are known, and if the type of fault is known to be a particular type, then the fault-tolerant coding technique according to the present invention can be tuned to that particular type of fault. In addition, the fault-tolerant coding technique can be implemented for handling any kind of fault, simple or complex, as shall be discussed further herein below.

As used herein, "FAULT" refers to a device which has been determined to be faulty. That is, during a programming and read-back of programmed data of each memory device in the array, if the data read back is different from what was programmed, then the device is faulty. In accordance with the present invention, when a device is determined faulty, then a fault tolerant code is inserted into a subsequent sequential memory device in the array for indicating that the previous memory device is a FAULT. The fault tolerant code thus provides an indication when the array is read to ignore the data of the previous device and substitute therefore data contained in a device following the fault tolerant coded device, according to the present invention. For example, the fault tolerant code "BAD" can be used to indicate that the previous device was determined to be faulty, further wherein BAD corresponds to a prescribed data value stored in a memory cell or device of the sequential memory array.

In a fault tolerant 2-bit memory, the BAD code may correspond to a level 5, wherein the level 5 is a level of charge (or current) different from the prescribed four levels of charge (or current) for the 2-bit memory device of a good device. (See FIG. 6) In terms of fault tolerance, an extra charge level (or current level) in each device advantageously provides a means for signaling the occurrence of a faulty device when a previous device is found to be faulty. Alternatively, the BAD code could be an unused digital code within the standard code levels within a device, according to a particular application (i.e., code "11" assuming that the value "11" is never used to store data).

In use, after a memory array has been programmed, including use of the fault tolerant coding according to the present invention, the data contained in a device occurring subsequent to the fault tolerant coded device is used to replace the bad data contained in the faulty device. The present invention is applicable to sequential reading of a memory array. In accordance with the invention, a next device is used to code that a previous device was determined faulty. It is the device after the fault tolerant coded device that is used to substitute or replace data originally intended for but not programmed into the faulty device. The fault tolerant coding according to the present invention is embedded into the memory array every time the memory array is written to or programmed. Faults are thus defined each time the memory array is written to. Thereafter, during reading of the stored data from the memory array, error-free data can be obtained.

In accordance with the present invention, a fault-tolerant method and apparatus for multi-level memories advantageously requires a minimal overhead in terms of redundant devices. That is, for simple faults, only a single extra device is needed for each faulty device. In essence, the fault-tolerance method and apparatus according to the present invention employs a fault-tolerant code or coding technique when programming a device to indicate when a previous device in a sequence of devices is faulty. To implement the method and apparatus of the present invention, a memory device must meet two constraints. First, the memory must employ multi-level or analog storage techniques, for example, such as, an electrically erasable non-volatile memory cell (FLASH EEPROM) designed for use in analog computing devices in the charge domain, as discussed, in U.S. Pat. No. 5,592,418, assigned to the assignee of the present invention and incorporated herein by reference. Second, the memory must support only sequential access.

The present invention is applicable to sequential access memory devices in comparison with random access memories. That is, random access memories allow for any memory location to be read by presenting and decoding of an address. Sequential access memories do not allow random access but instead read out memory locations sequentially from a single random address which identifies the sector to be read. Sequential address memories are especially well suited to applications storing large amounts of sequentially accessed user data (for example, files) such as that which may be generated in applications of speech storage or digital still imaging.

Figures 5, 6:
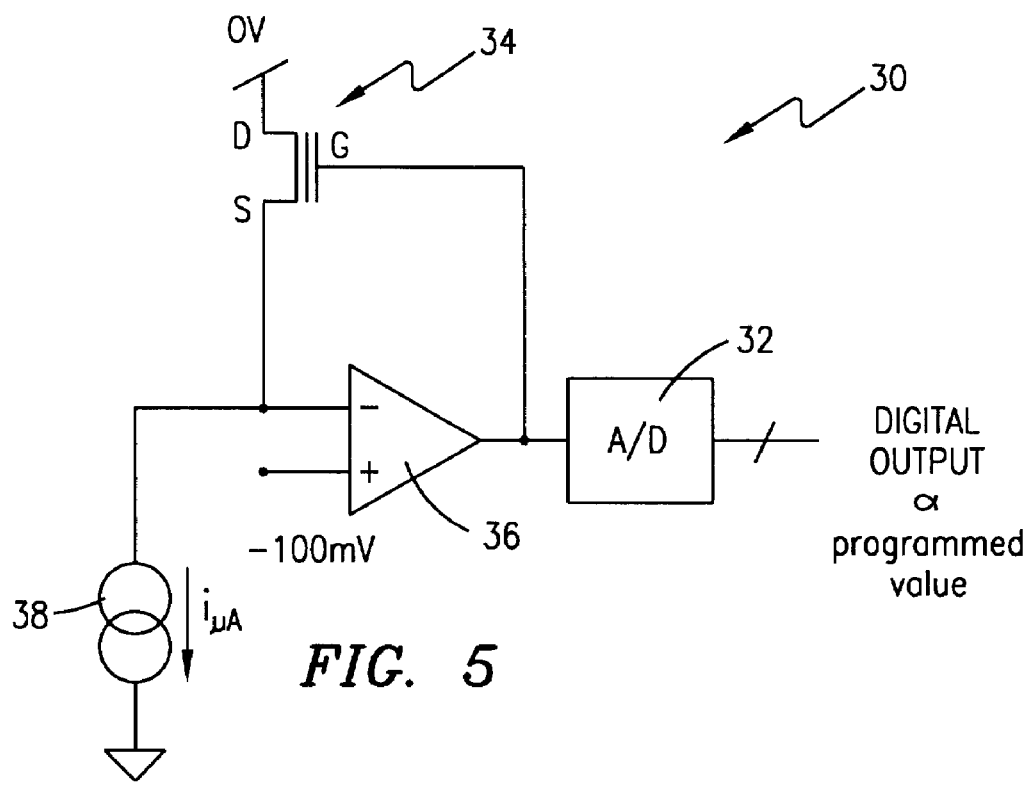
FIG. 5 illustrates an exemplary electrical circuit for use in reading a stored value from floating gate MOSFET device using conductance.
FIG. 6 illustrates a fault-tolerant 2-bit multi-level memory having $2^n+1$ levels according to the present invention.

With respect to fault-tolerant codes, the present invention utilizes a fault-tolerant coding technique for providing device-level fault-tolerance in a sequential access multi-level memory array. If a multi-level (analog) memory contains n bits, corresponding to 2n levels (charge or current levels), then the fault tolerant code according to the present invention is defined by adding at least a single additional level to the memory or $2^n+1$ levels. An mentioned earlier, an example of coding a two-bit memory is shown in FIG. 1. For a two-bit memory according to the present invention, the fault-tolerant code includes five (5) levels as shown in FIG. 6, wherein the fifth level corresponds to the BAD code.

Figure 7:
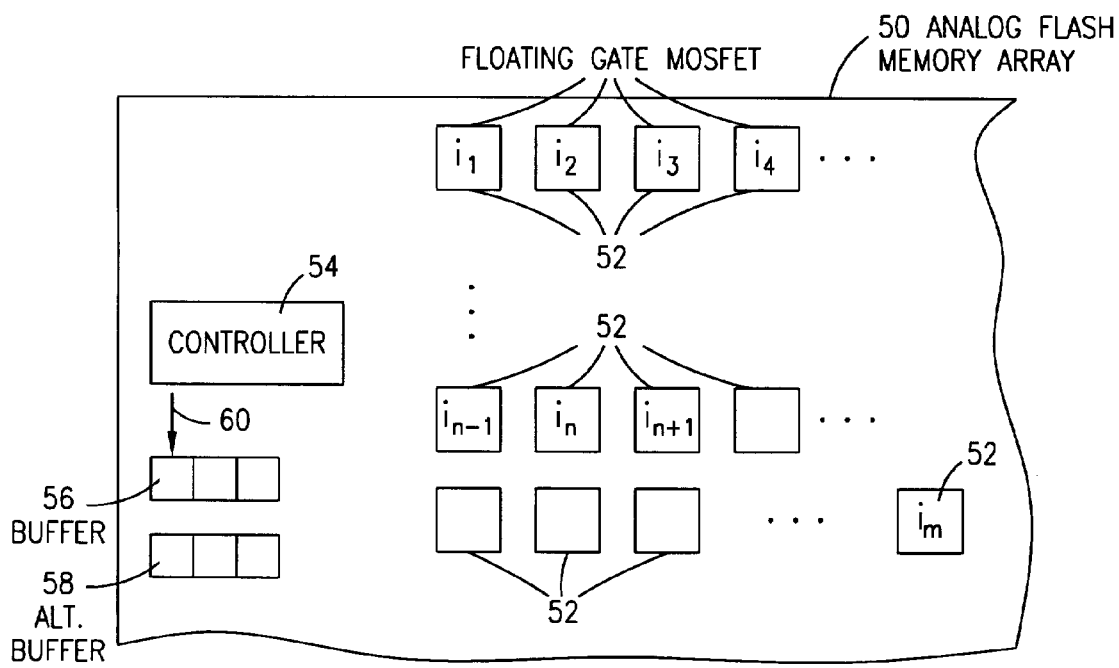
FIG. 7 illustrates an exemplary sequential memory array incorporating the fault tolerant coding technique and apparatus of the present invention.
Figure 8:
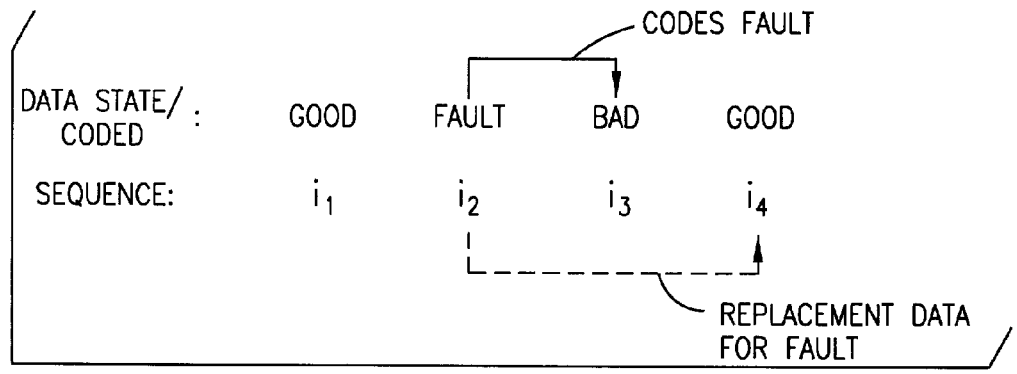
FIG. 8 illustrates fault tolerant coding of a faulty device according to the present invention.

As discussed earlier, a faulty device is defined as a device having an unknown (i.e., random) or uncontrollable data value. That is, the data value of the faulty device is unknown or uncontrollable, since if the data value of the device could be controlled during a programming thereof, then the device would not be faulty. The fault tolerant code according to the present invention is used by programming a next sequential device after a faulty device to have a value equal to a "BAD" code (i.e., corresponding to level 5 in the example given in FIG. 6). The "BAD" code corresponds to the additional charge or current level added to the memory in accordance with the present invention. When detected, the "BAD" code informs the memory array controller that a previous data value was bad, therefore, the next device in the sequence following the "BAD" code device should be read to replace the data value of the faulty device. This is illustrated in FIGS. 7 and 8. The concept of "next device" enables the fault-tolerant multi-level coding technique of the present invention to work with sequential access memories, in contrast with random access memories.

Referring briefly to FIG. 7, an analog flash memory array device 50 includes a sequential array of floating gate MOS-FET devices 52. Device 50 further includes a controller 54. Controller 54 is used to carry out the fault-tolerant coding of the present invention. A main buffer 56 and an alternate buffer 58 are also included, as will be discussed further herein below.

Figure 9:
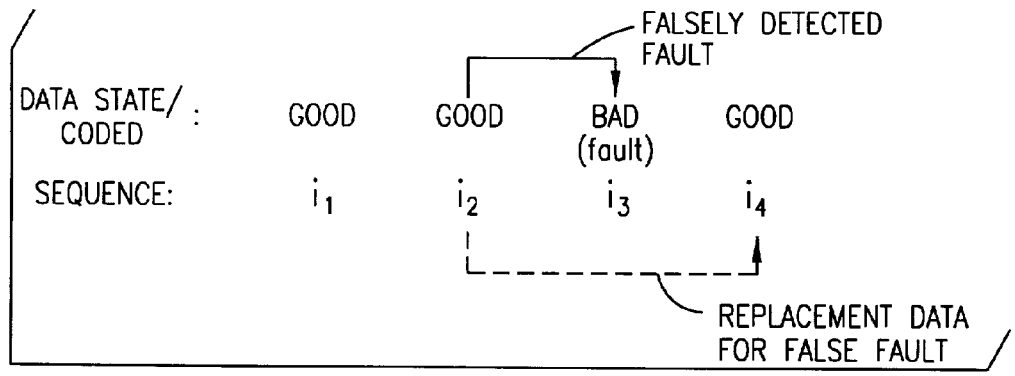
FIG. 9 is exemplary of a falsely detected fault.

Fault detection with fault tolerant coding according to the present invention shall now be further explained. Faults are detected by an inability to program a device to a desired data value (i.e., current or charge level). There is no way of knowing apriori a faulty data value, although if this can be measured statistically it can be used to improve the assignment of fault-tolerant codes. If there is any uncertainty that a fault produces or results in the issuance of something other than the BAD code, then it is necessary to have a way of handling false BAD's. That is, a false BAD occurs when it cannot be determined for sure that a fault results in a non-BAD code. A technique as discussed further herein below must be employed to handle this false BAD. There are at least two techniques for handling a false BAD depending on the statistical nature of the faults. For example, in the instance of permanent faults, if a fault results in a permanent faulty charge or current level, including the BAD level, then the solution is to continue with data of the falsely detected fault as shown in FIG. 9.

In the instance of non-permanent faults, if a fault results in a non-permanent faulty charge or current level during programming and can vary over the life of the device, then the situation is more complex. That is, for the non-permanent faulty charge level, a fault results in a false "BAD" level during programming, but will move to a valid data value over time so that the fault is not corrected during a subsequent reading of the device. Alternatively, for the non-permanent faulty level, a fault may result in a good (non-BAD) level during programming, but moves to the BAD level over time, which results in a good data level being falsely corrected. In the situation of the non-permanent faults, some higher level coding scheme based on the statistics of the memory faults must be used. This may result in higher costs, for example, additional coded levels or additional devices lost for each fault, however, device-level fault-tolerance in a sequential access memory is maintained.

To illustrate the fault-tolerant coding according to the present invention, consider a memory in which the probability of two sequential faults is small (but non-zero), while the probability of three sequential devices being faulty is zero (or very close to it). In this instance, a fault tolerant code can be coded onto the four devices following a bad device using the following scheme:

For a simple fault, the fault tolerant coding is given by:

| DATA STATE/CODED: | GOOD | FAULT | BAD | GOOD | GOOD | GOOD |
|---|---|---|---|---|---|---|
| SEQUENCE: | $i_1$ | $i_2$ | $i_3$ | $i_4$ | $i_5$ | $i_6$ |

Figure 10:
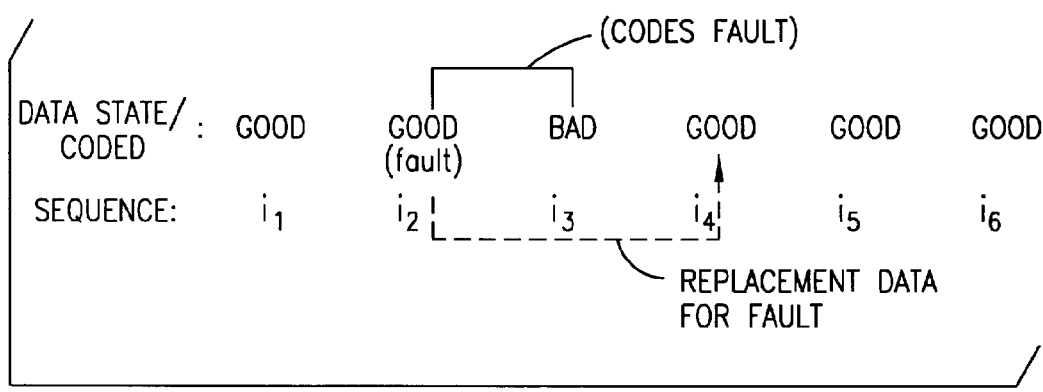
FIG. 10 illustrates fault tolerant coding according to the present invention in which a fault is in a GOOD state.
Figure 11:
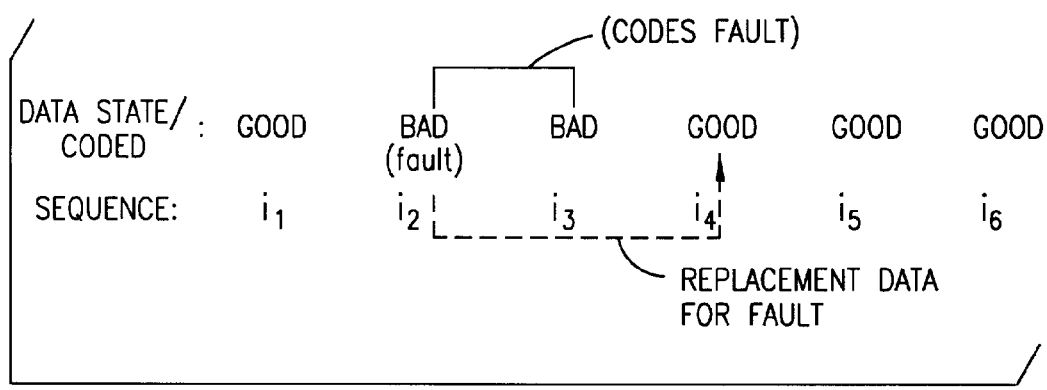
FIG. 11 illustrates fault tolerant coding according to the present invention in which a fault stores a BAD code.

If the fault, either during programming or after programming, is in a good data state, then the sequence looks as shown in FIG. 10. If either during programming or after programming the fault stores the BAD code, then the sequence looks as shown in FIG. 11. In the latter example, the problem of the false "BAD" is overcome by using a "double BAD" code to detect it. The latter code can only arise in the case of a false BAD, and thus the particular situation thereof is uniquely identified. A true double fault will be considered a complex fault as discussed further herein below.

Figure 12:
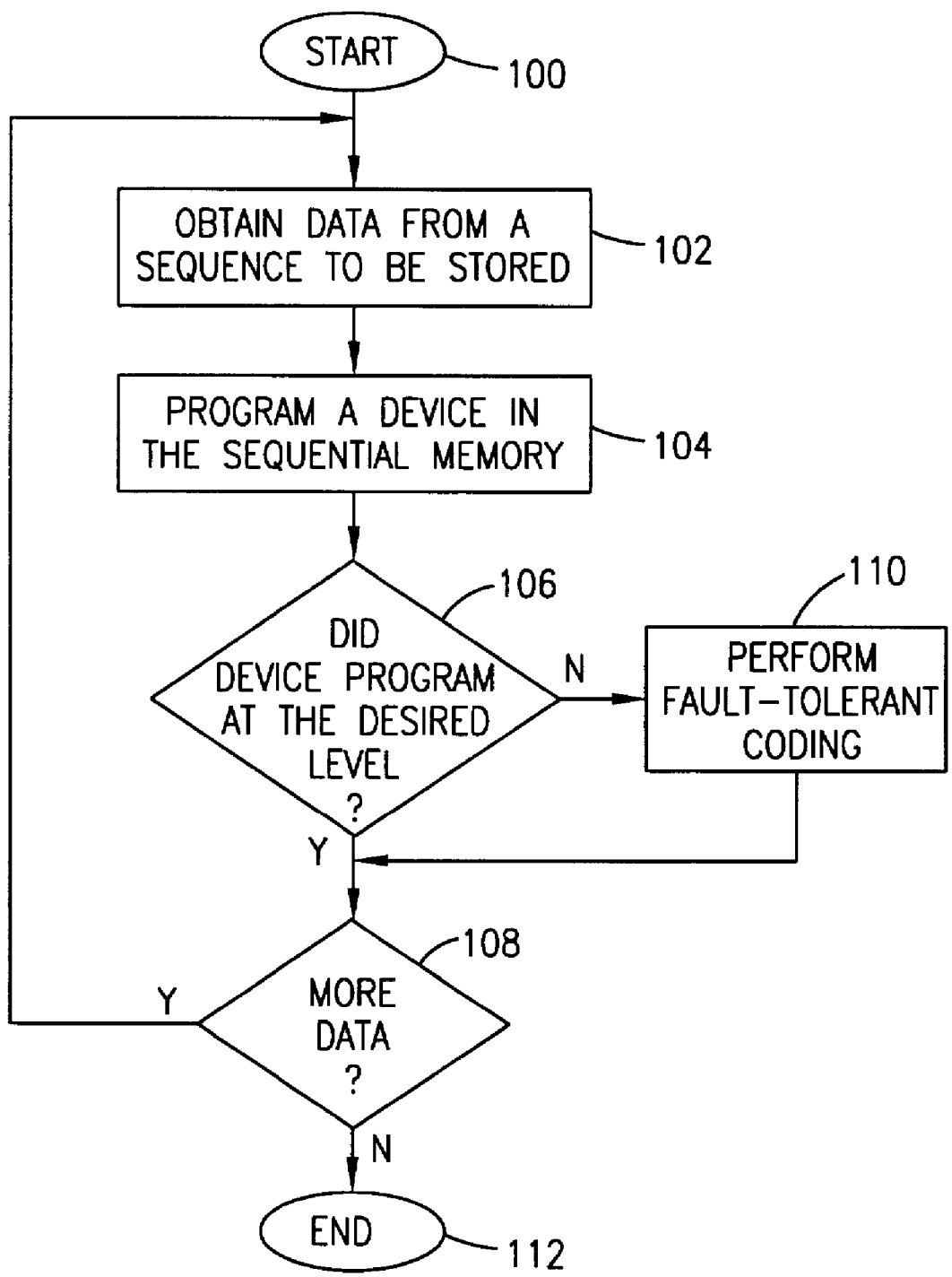
FIG. 12 illustrates a flow chart for programming of an array according to the fault tolerant coding of the present invention.

Referring now to FIG. 12, programming of an analog flash memory array with fault tolerant coding according to the present invention shall now be briefly explained starting at step 100. Data to be stored is obtained from an appropriate source, in a sequential manner as indicated by step 102. One data is stored in the sequential array at a time as indicated by step 104. Subsequent to the programming of the current device in the sequential memory array, the memory controller or other suitable controller checks the stored value of the device just programmed to determine whether or not the device programmed at the desired level, as indicated in step 106. If the device did program to the desired level (i.e., a GOOD value), then the programming of the memory array continues with the next data of the sequence of data to be stored. That is, if more data is to be stored (step 108), then the process goes to the step of obtaining data from the sequence of data to be stored. If the device did not program to the desired level (step 106), then that particular device is faulty. Upon the determination of a faulty device, fault-tolerant coding of a subsequent device with the BAD code is carried out by the controller, as per step 110. The process then continues as shown in FIG. 12, ending at step 112.

Figure 13:
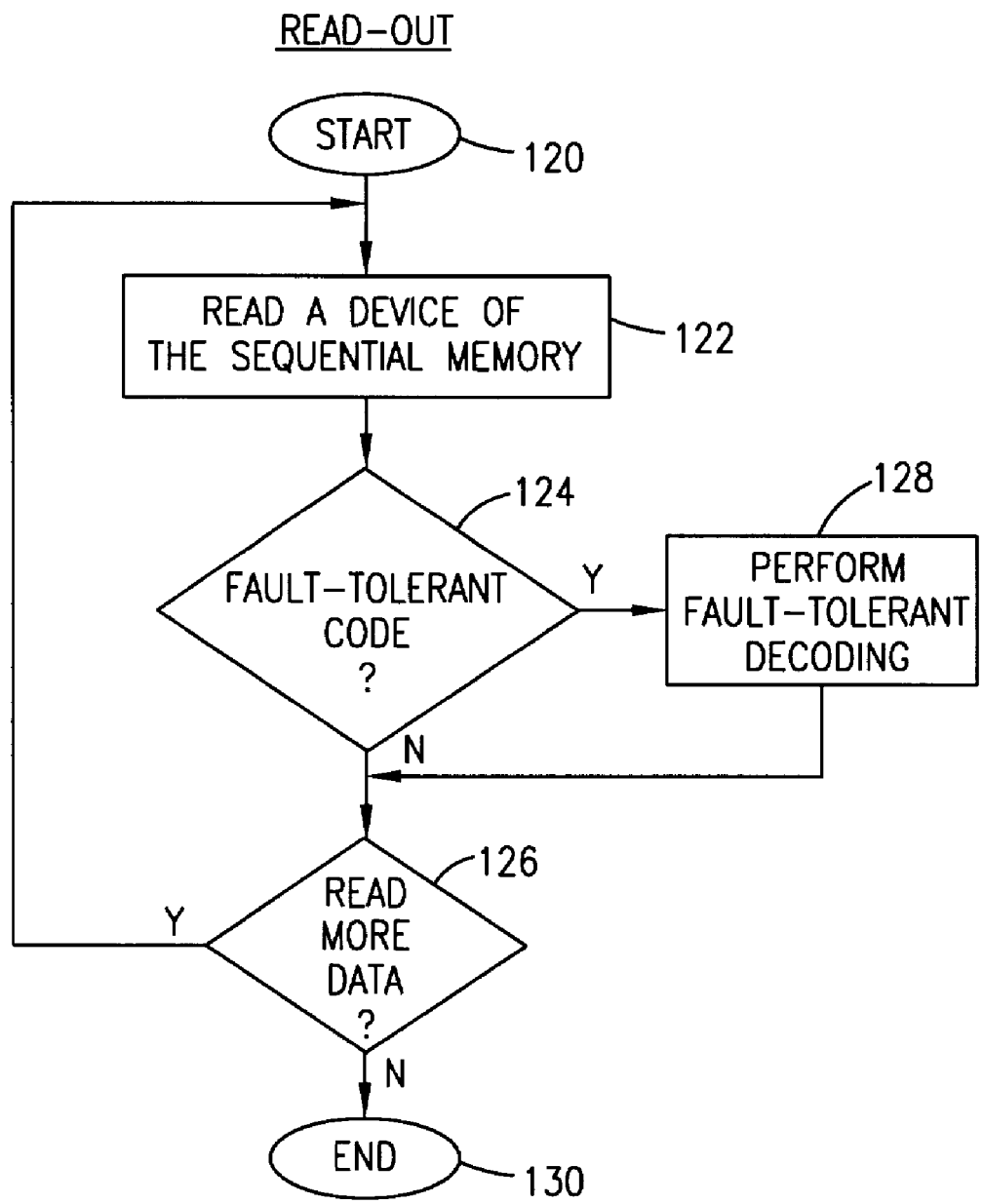
FIG. 13 illustrates a flow chart for reading from the array according to the fault tolerant coding of the present invention.

Turning now to FIG. 13, reading out data from an analog flash memory array programmed in accordance with the fault-tolerant coding method of the present invention shall be briefly discussed starting at step 120. Beginning with a first device of the sequential memory array, a data value is read therefrom as indicated in step 122. Next, a comparison is made to determine if the data value is the fault-tolerant code, i.e., BAD, as per step 124. If the data value is not the fault-tolerant code, then the process continues with the next memory device in the array. That is, if more data is to be read (step 126), then the process goes to the step of reading a next device of the sequential memory array (step 122). If the data value read from the memory device corresponded to the fault-tolerant code, i.e., BAD, then fault-tolerant decoding according to the present invention is performed, as ending at step 128. In the instance of a simple fault, i.e., a single faulty device, the controller looks to the subsequent memory device which occurs after the fault-tolerant coded device for replacing the value obtained from the faulty device. That is, the faulty device is the device in the sequence prior to the fault-tolerant coded device. The process then continues as shown in FIG. 13, ending at step 130.

To further discuss the various fault situations in a sequence of devices of a memory device, the following symbolism shall be used for illustration purposes.

g-good device, coded with a desired value (non-BAD);
    b-good device, coded with the BAD fault-tolerant code;
    F-faulty device, not coded with a desired value;
    G-faulty device, stuck at a level within good levels; and
    B-faulty device, stuck at the BAD code level.

Any fault-tolerant code will introduce overhead in terms of the number of devices needed to correct a single type of fault, as well as coverage, in terms of which types of faults are able to be corrected by the code. The best fault-tolerant code suitable for any particular memory device will depend on the statistics of which types of faults are possible and with what probability specific to that memory device. For example, the fault tolerant code described in the preceding section is able to correct simple faults, defined as faults in which there is only a single faulty device within three consecutive devices in the memory. A memory device which is guaranteed not to have any faults other than simple faults can cover all possible faults with this simple fault-tolerant code because the only faults which will arise in such a memory device are one of the following two types:

ggGbg simple fault; and
    ggBbg simple false-BAD fault.

In the example above, the first good device following a bad device cannot be a fault because it is within three devices of the original faulty device, and so this good device completes the fault-tolerant code and the fault can be resolved. Note that the above fault tolerant code will not allow for recovery from a compound fault, that is, a fault in which there are two faulty devices within a sequence of three devices.

Other fault-tolerant codes can allow a memory to recover from more complex types of faults such as compound faults. These codes would be needed for a memory whose characteristics could not guarantee the occurrence of only simple faults. For example, consider a memory which has fault statistics guaranteeing that the memory has a rare but possible compound fault (2 faulty devices within a sequence of three devices) but which will never have more than 2 faulty devices within a sequence of 7 devices. An example of a more complex fault-tolerant code which will allow for coverage of this class of compound faults is described below. In addition, the memory described above can have faults of the following types: SIMPLE,SIMPLE and COMPOUND,COMPOUND. The definitions of these faults and how the fault-tolerant code presented in the example can handle them is also defined below.

SIMPLE FAULT

With respect to a SIMPLE FAULT, a SIMPLE FAULT is a single fault within 7 consecutive devices. The code for this type of fault will be to follow the fault with a single BAD code or state followed by three GOOD codes or states. That is, the codes may look like: ggggggFbggggg. Depending upon the state of the fault, one of two sequences could result. They are:

ggggggGbggggg or
    ggggggBbggggg.

According to the code thus described, these two states will be assigned the following identifiers, corresponding to the alternating sequence of bad and good devices starting with the first BAD code:

```
            v
     ggggggGbggggg    1-3
           ^_/

; and v
     ggggggBbggggg    2-3
           ^_/
```

In the above (and also applicable herein below), the "v" above the coded line indicates the location where the fault is resolved, and "^" below the coded line indicates the sequence location where data is replaced. The symbol "_/" indicates the source of a data restart, where the restart is "g" directly above "_/". Still further, the first instance is uniquely identified with the indication of (1–3), representing a set of codes including 1 BAD code followed by 3 GOOD codes. The second instance is uniquely identified with the indication of (2–3), representing a set of codes including 2 BAD codes followed by 3 GOOD codes.

SIMPLE CCWD FAULT

A simple compound fault is a double fault within 7 consecutive devices, but not within 4 consecutive devices. Note that, this constraint implies that, in fact, there can be no additional faults within a sequence of 11 total devices. The code for this type of fault will be to follow each fault with a single BAD state followed by two GOOD states. That is, the sequence may be as follows:

gggFbggFbgg.

The code for this type of fault uses twice the code for a simple fault, and depending on the state of the faults, a simple compound fault can result in one of four possible identifiable sequences:

```
          v
 gggGbggGbgg    1-3 (simple fault+open single fault)
      ^_/ v
 gggGbggBbgg    1-2-2-2
      ^_//__/ v
 gggBbggGbgg    2-3 (simple false-bad fault+open
      ^_/           single fault)

v
 gggBbggBbgg    2-2-2-2
      ^_//__/
```

Note that the overhead for a simple compound fault is the same as that for a simple fault, i.e., one device per fault.

COMPOUND FAULT

A compound fault is a double fault within 7 consecutive devices and also within 4 consecutive devices. The codes for this type of fault will depend on the exact location of the faulty devices within the sequence of devices. There are three possible locations including consecutive, separated by one, and separated by two. The codes for each of these is the following:

gggggFFbbbgg (2 consecutive faults)
ggggFbFbbgg (2 faults separate by one good device)
gggFbgFbgg (2 faults separated by two good devices)

There are four possible sequences for each of these three classes of compound faults. This leads to a total of twelve (12) sequences which are enumerated herein below. Note that while several of the sequences lead to the same identifier, the fault-repair for all cases with the same identifier is the same, meaning that the same code provides fault-tolerance for all sequences with that code, regardless of whichever class of compound fault they come from. Note also, that for any class of fault, the fault correction is the same, meaning that the correction is independent of the state of the faulty devices and hence robust against the state of the faulty devices changing between writing and reading (this is true for all faults listed above as well).

CONSECUTIVE:

```
          v
 gggggGGbbbgg    3-2
      ^___/ v
 gggggGBbbbgg    4-2
      ^___/ v
 gggggBGbbbgg    1-1-3-2
      ^___/ v
 gggggBBbbbgg    5-2
      ^___/
```

SEPARATED BY ONE:

```
          v
 ggggGbGbbgg    1-1-2-2
     ^___/ v
 ggggGbBbbgg    4-2
     ^___/ v
 ggggBbGbbgg    2-1-2-2
     ^___/ v
 gggBbBbbgg     5-2
    ^___/
```

SEPARATED BY TWO:

```
          v
 gggGbgGbgg    1-2-1-2
    ^___/ v
 gggGbgBbgg    1-1-2-2
    ^___/ v
 gggBbgGbgg    2-2-1-2
    ^___/ v
 gggBbgBbgg    2-1-2-2
    ^___/
```

The overhead for all of these compound faults, regardless of class, is three (3) devices for two faults, or 1.5 devices per fault. Thus the codes as discussed provide an overhead of 1 device for simple faults, 1 device for the much rarer simple compound fault, and 1.5 devices for the also rare compound fault.

The set of codes are summarized herein below to show that they are uniquely identifiable. The sequence of *'s occurring after particular codes herein below indicate codes whose appearance are identical and whose repair actions are identical. That is, in such instances, repair actions taken are similar for resolving the particular fault.

SIMPLE 1-3
2-3

SIMPLE COMPOUND 1-3
1-2-2-2
2-3
2-2-2-2

COMPOUND CONSECUTIVE 3-2
4-2                    *
1-1-3-2
5-2                    **

COMPOUND SEPARATED BY ONE 1-1-2-2                ***
4-2                    *
2-1-2-2                ****
5-2                    **

COMPOUND SEPARATED BY TWO 1-2-1-2
1-1-2-2                ***
2-2-1-2
2-1-2-2                ****

In the case of code in the example as presented herein, the fact that the statistics of the fault make it impossible to have more than 2 faults within 7 devices is exploited in a fault tolerant code that has a maximum length of 9 devices. These 9 devices correspond to the last two good devices read, which must be retained in a buffer, and a maximum code sequence of 7 devices, which must also be buffered to resolve the fault. Use of two buffers of this length and a controller (or state machine) allow an implementation of these codes for both reading and writing, but the details of this implementation will not be discussed, as implementation details of a more complex code are presented herein below. An implementation of this code would involve a similar but simpler mechanism as that of the more complex code to follow, as the compound code described herein above is limited to a maximum code length of seven devices, while the code to follow effectively imposes no limitation on code length.

Fault tolerant coding relies on the fact that the statistics of the faults within a memory are restricted to certain limitations which can be exploited in the determination of the code. The most general for this restriction is to have a memory where a prescribed number of n faults in a sequence is impossible, where n is an integer.

Turning now to this further complex fault situation, coding for the situation of a complex fault according to the present invention is accomplished using the fact that for a particular analog flash memory array, a prescribed number of n faults in a sequence is impossible, where n is an integer. That is, during a manufacturing of the particular type of analog flash memory array, all memory arrays having n or more faulty devices in a sequence of the sequential array were discarded or thrown out. Such latter devices are thus not used and thus only those devices having less than n faults in a sequence exist. Thus, given the above, n faults in a sequence in the memory array are not possible. This fact allows for the occurrence of n GOOD values in a sequence to be used as the code to indicate that the data values occurring after the occurrence of a sequence of n BAD coded devices are ok (i.e., ALL OK).

In the situation of a complex fault, data read from the sequential memory array is temporarily stored in a buffer. The data is stored in the buffer until it is determined that the data is not faulty, or if faulty, is replaced with valid data subsequently occurring in the sequence of the memory array. At a minimum, n data values are temporarily stored in the buffer. Memory array 50 as shown in FIG. 7 thus contains a main buffer 56 and an alternate buffer 58, as shall be further understood from the discussion below and with reference to 14A–14E.

As mentioned above, the fault-tolerant coding technique according to the present invention uses the fact that n faults in a sequence abutting one another is impossible. Thus, when n good devices, not coded with the BAD fault-tolerant code are read and which abut one another, then the latter occurrence of the n good devices in a sequence is used as a stop code to indicate the occurrence of an ALL OK condition. Data values which are read from the sequence of memory devices 52 in the array 50 are temporarily buffered in main buffer 56 until an occurrence of an ALL OK stop code condition. For example, in the following sequence:

gggggggFbgggggggFbggggggggggggggggFbgggggggggggggg the three data values occurring prior to the "b" code are stored in the buffer 56. Upon the occurrence of the three "g's" after the "b" code, the stored buffer values are released, since the occurrence of the three "g's" after the "b" code is indicative of an ALL OK condition. In other words, the two devices prior to the faulty device are actually good devices. The fault situation in this example is thus that of a simple fault.

A complex fault situation occurs during programming of the sequential memory array 50 when, after the occurrence of a bad code b, the next n devices are not all good codes g. In the complex fault situation, programming of the sequence of devices 52 in the memory array 50 would result in the coding of bad codes b until a sequence of n bad codes b can be written, as will be discussed further herein below. The ability to code n bad codes is indicative of the devices 52 being coded are good devices. After the coding of n bad codes, data values occurring subsequent to that data which occurred at a last point in the sequence of data from which it was determined ALL OK, would then be written in the devices immediately following the n bad coded devices (provided that the devices immediately following the n bad coded devices are good devices, otherwise coding for the complex fault has not yet been finished). That is, after the coding of n bad codes, control data d is written into the m devices immediately following the n bad coded devices. As will be discussed in the following section, m is an integer having a value typically between 1 and n. After coding of the m control data codes (i.e., subsequent to the coding of the complex fault situation), the writing of data from the sequence of data into the memory array 50 would then continue in the array. A sequence of n good data elements following the m control data elements signals ALL OK, allowing the fault to be fully resolved. If the sequence of n good data elements is not successfully written, then the fault in not resolved and coding of the complex fault continues next with a sequence of n bad codes BAD as described previously. Otherwise, writing of data would then continue.

For complex fault situations, a pointer 60 is used with respect to buffers 56 and 58. In addition, the pointer is defined by a control data (D) contained in a prescribed memory device 52 for indicating how far back in the sequence of memory devices 52 to go until the beginning of the complex fault. For this, one or more good devices occurring immediately after the n bad coded devices are used for storing control pointer data (D). The specific number of devices used for pointer information depends upon the number of levels of a single device. For example, a 4-bit memory device could be used for pointing to a device 16 devices back in the sequence of devices of the memory array from the pointer device. Similarly, an 8-bit memory device could be used for pointing to a device 256 devices back in the sequence of devices of the memory array from the pointer device. A complex sequence can be illustrated, for example, as follows, where "x" indicates any condition, the beginning of the complex fault situation is indicated by the "^", and the end of the complex fault situation is determined by the occurrence of "bbbDggg":

$$ggggfxxxxxxxbbbDggg$$
         ^

In the example given, the control pointer device D would contain a value of ten (10) which indicates that the complex fault situation began ten (10) devices prior to the device containing pointer data.

Still further, a fixed-length field of more than one device 52 may be used for pointing back to the start of a complex fault situation as may be necessary for a particular fault-tolerant coding situation. For example, the complex fault situation may look like the following:

$$ggggfxxxxxxxxxx...xxxbbbDDDggg$$
         ^ where the information stored in the devices of the DDD coded devices 52 after the bbb coded devices 52 in the memory array 50 contain a value for pointing to the start of the complex fault situation indicated as shown by the "^". Note that this fixed field code is only one case, since m may exceed n.

Thus, if n faults in a sequence of the memory array 50 are impossible, for reasons stated earlier herein above, then more than one fault in n results in the occurrence of a complex fault situation. Furthermore, there will eventually be enough good devices 52 in the sequence of devices 52 of the memory array 50 to code n bads plus data plus n goods. For example, the latter may be represented by "bbbDggg", as discussed above.

Other codings are also possible for the coding of a complex fault situation. For instance, it may be desired to implement a variable control data coding for use with various sized complex fault situations. Coding of a simple complex fault situation includes n bads (b) plus default data (D) plus n goods (g) for signifying the end of the simple complex fault situation. Alternatively, the coding of n bads (b) plus default data (D) plus additional data (<n) plus one bad (b) plus n goods (g) can be used to signify the end of an extended complex fault situation. That is, a single BAD can be used to indicate an end of a variable length data field. The same can -also act as a subcode to indicate that a variable field is completed. In the complex fault situation, a real bad would not be followed by three goods. In the simple complex fault situation, the coding of "bbbDggg" can handle a back pointer (D) of up to a length of 16-256 (enough for almost all circumstances). In the extended complex fault situation, the coding of "bbbDDbggg" can handle a back pointer DD of up to a length of 256-65K, and so forth.

FIGS. 14A–14E further illustrate steps for handling a decoding of fault-tolerant coded devices of a memory array according to one embodiment the present invention in further detail. Assuming a memory has been programmed in accordance with the present invention as previously discussed, reading of data from the sequential memory array begins at step 300 in FIG. 14A. In step 302, appropriate pointers and values in the sequential array are initialized, including an instream position, outstream position, buffer position, and next output position. With respect to fault tolerant decoding, the position of data in the main buffer, alternate buffer, in addition to a current position in the data stream of the sequential memory devices is used as discussed herein. In step 304, a value (VAL) is read from a next device of the sequence of devices, beginning with a first device in a sequence of devices (until the maximum in stream position is reached). The value read is then tested in step 306. If the value is something other than that corresponding to the BAD code, then the value is GOOD. The GOOD value is shifted into alternate buffer 58 at step 308. On the other hand, if step 306 indicates a BAD code, then the process continues at step 310. Assuming a GOOD value in step 306 and after step 308, the process then resumes at step 312 with the reading of a next value (RNV). The value is then tested (T) at step 314, similarly as in step 306.

If the output of step 314 is that the value indicated the BAD code, then the process continues at step 310 or COMPLEX 1. If at step 314, the value is a GOOD value, then the value is placed in alternate buffer 58 (FIG. 7) at step 316. At step 318, a value is read from the next device in the sequence. That value is then tested at step 320. If BAD, then the process continues at step 310. Otherwise, the value is GOOD and the process continues at step 322 (RESOLVE).

Figure 14A:
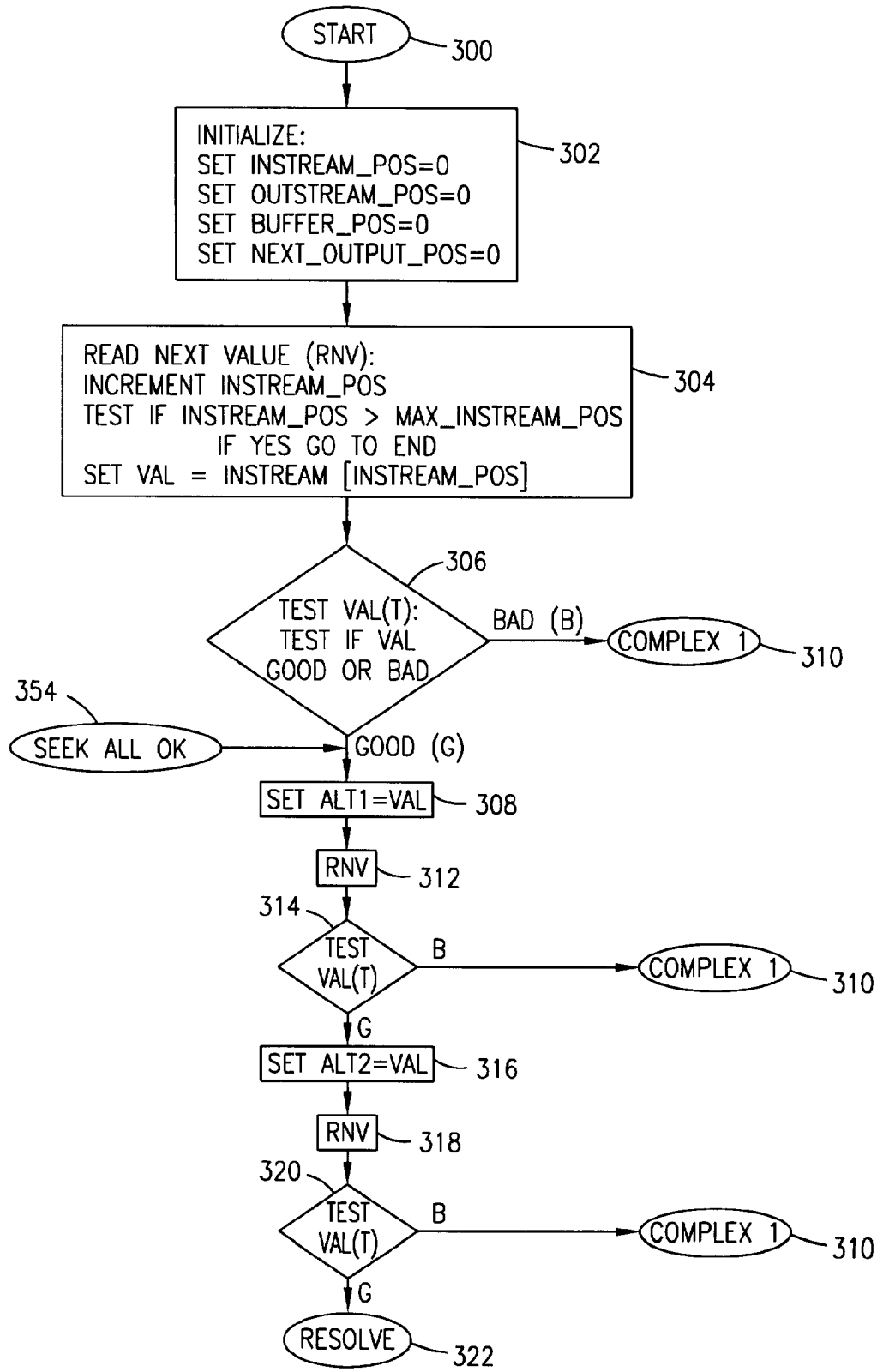
FIGS. 14A–14E illustrate a flow chart for fault tolerant decoding in further detail according to one embodiment of the present invention.
Figure 14B:
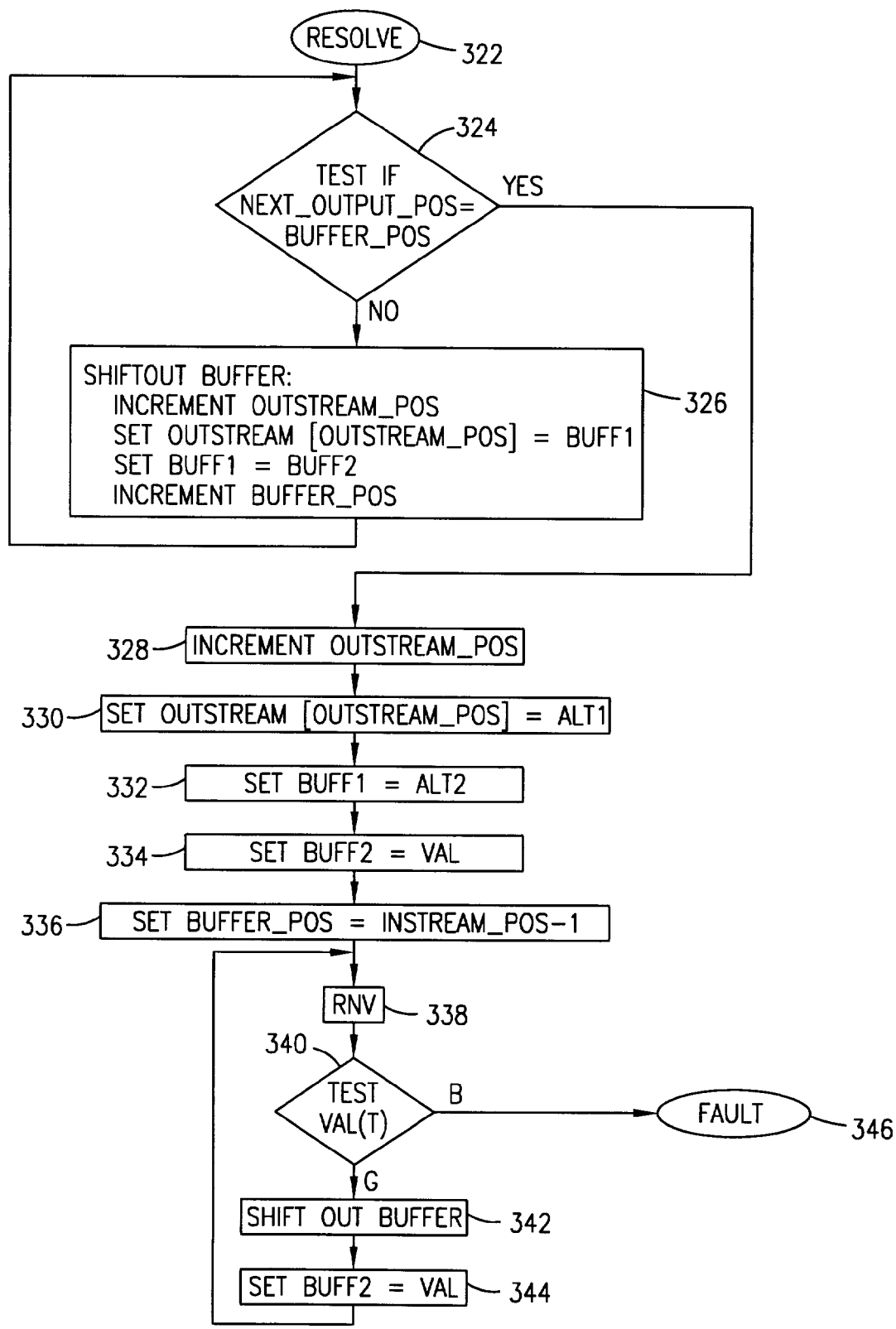

Turning now to FIG. 14B, resolve step 322 begins with a test. That is, in step 324, test if the next output position of the sequence of devices equals the buffer position. If not, then the process continues at step 326. At step 326, the buffer 56 contents and the outstream position in the sequence are updated. Steps 324 and 326 are repeated until the next output position of the sequence is equal to the buffer position. At step 328, the output stream position is incremented. In steps 330–334, the first value previously stored in the alternate buffer is inserted into the outstream at the current outstream position. The second alternate buffer value is inserted in the main buffer, along with the most recent value. In step 336, the buffer position is adjusted. At step 338, a next value is read. In step 340, the value is tested. If GOOD, then at step 342, the buffer contents and the outstream position in the sequence are updated (similar to step 326). Next, at step 344, the current value is stored in the main buffer. The process then proceeds again to step 338.

Figure 14C:
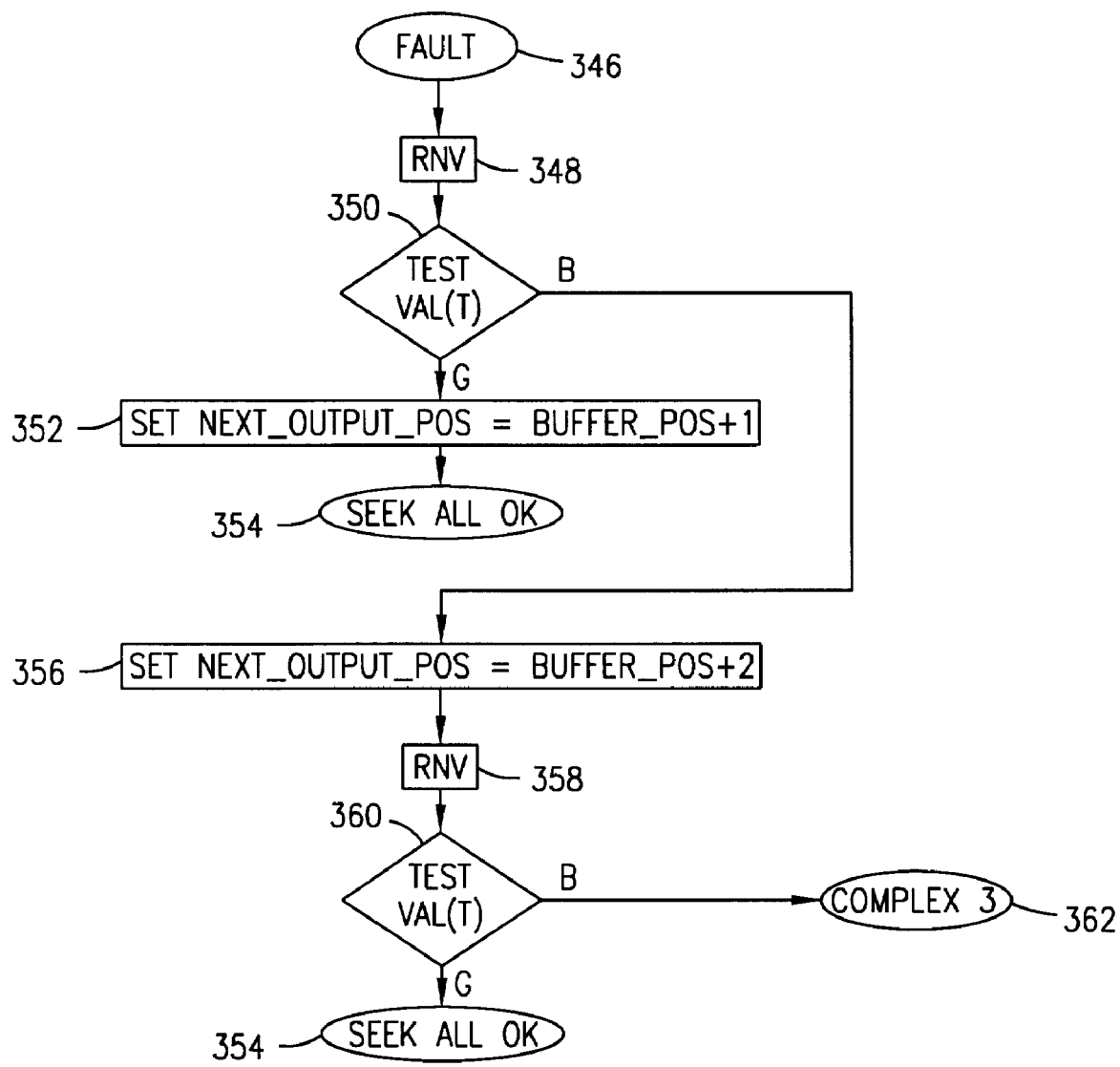

At step 340, if the next value tested BAD, then the process continues at step 346 (FAULT). Turning now to FIG. 14C, resolution of a fault continues at step 348 with the reading of the next value. At step 350, the value is tested. If GOOD, then the process continues at step 352 with an updating of the next output position. Subsequent to step 352, the process continues at step 354, seeking the ALL OK condition (as previously discussed).

If the output of testing step 350 is the BAD code, then the process continues at step 356. At step 356, the next output position is updated. The process continues at step 358 with the reading of the next value. The value is tested at step 360. If GOOD, then the process continues at step 354, seeking the ALL OK condition. If BAD, then the process continues with step 362 or COMPLEX 3.

Figure 14D:
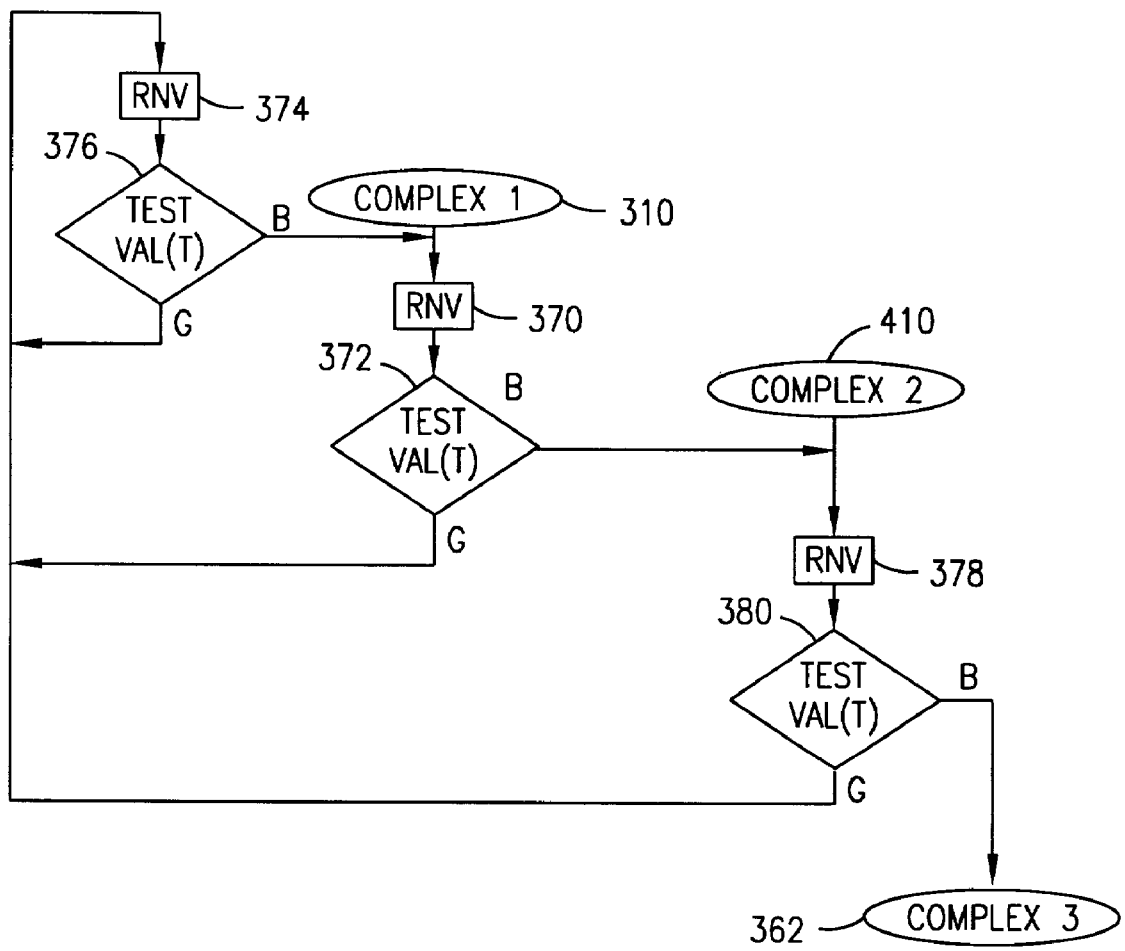

Turning now to FIG. 14D, resolution of a complex fault situation continues with step 310 or COMPLEX 1. A next value is read at step 370 and tested at step 372. If GOOD, then read the next value at step 374 and test at step 376. If, at step 376, the value tests GOOD, then repeat step 374 and step 376 again. Not until a next value contains the BAD code does the process continue at step 370. COMPLEX 1 is a routine which is looking for the occurrence of two BAD codes in a row. At step 372, if the value tested is the BAD code, then the process proceeds at step 378 with reading a next value. That value is tested at step 380. If GOOD, then the process continues at step 374. If BAD, then the process continues at step 362 or COMPLEX 3.

Figure 14E:
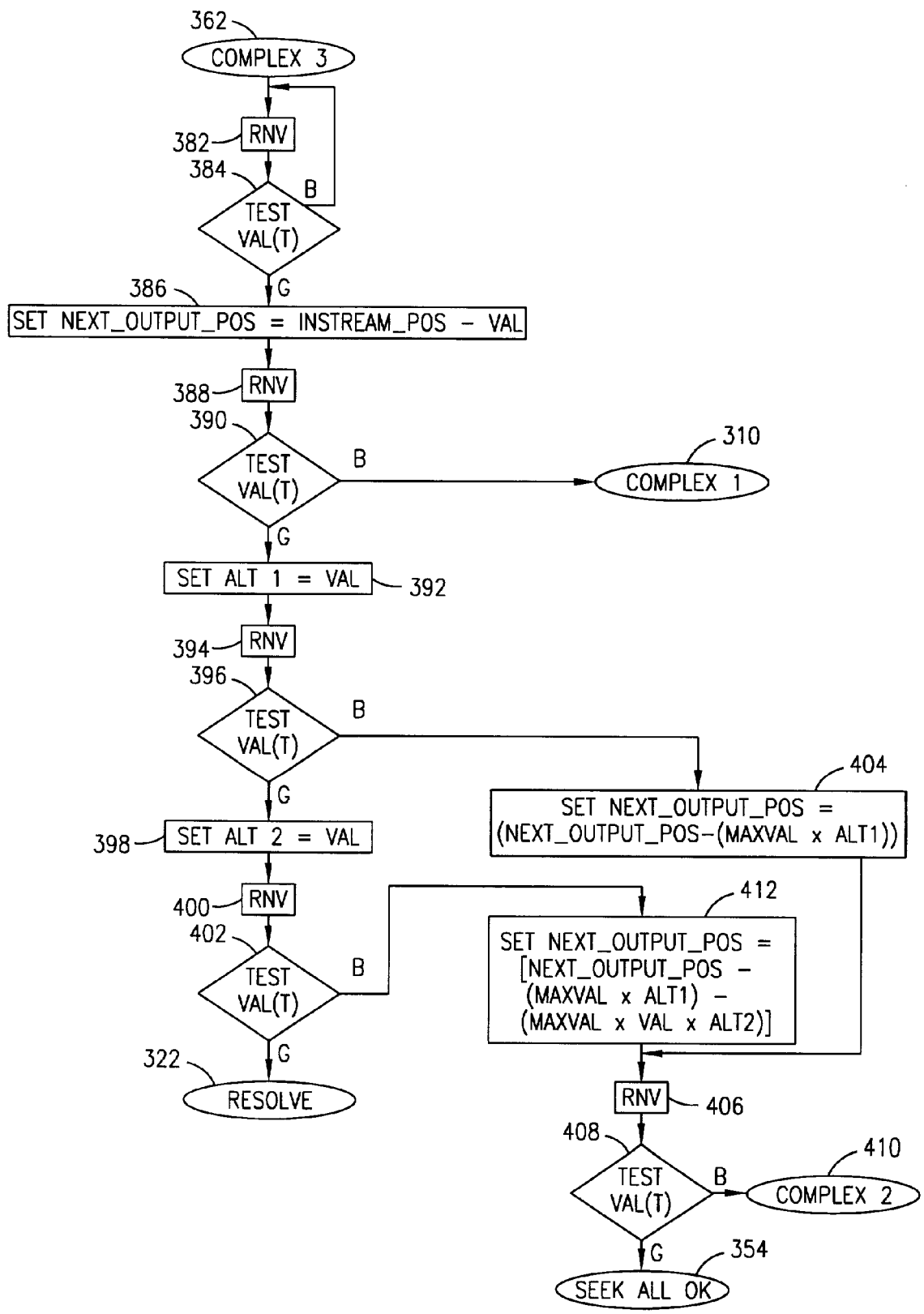

Referring now to FIG. 14E, resolution of a complex fault situation with fault-tolerant coding according to the present invention shall be concluded with a discussion of COMPLEX 3 at step 362. At step 382, a next value is read and tested at step 384. If at step 384, the value corresponds to the BAD code, then the process repeats at step 382 with the reading of a next value. When a GOOD value is obtained at step 384, the process continues at step 386 where the next output position is equal to the instream position minus a data pointer value. At steps 388 and 390, a next value is read and tested. If the value corresponds to the BAD code, then the process continues at step 310 for the resolution of a complex fault situation as discussed with respect to FIG. 14D.

If the value tested GOOD in step 390, the process continues by placing the current value in the alternate buffer at step 392. At steps 394 and 396, a next value is read and tested. If GOOD, then the current value is placed into the alternate buffer at step 398. At steps 400 and 402, a next value is read and tested. If GOOD, the process proceeds with step 322 (RESOLVE), as discussed with respect to FIG. 14B.

Referring still to FIG. 14D at step 396, if the value corresponded to the BAD code, then the process would continue at step 404. At step 404, the next output position is updated. A next value is read at step 406 and tested at step 408. If the value at step 408 tested GOOD, then the process continues with the seeking of the ALL OK condition at step 354. Alternatively, if the value at step 408 indicated a BAD code, the process continues with step 410 or COMPLEX 2. COMPLEX 2 is shown on FIG. 14D and is part of the procedure for resolution of a complex fault situation as discussed with respect to COMPLEX 1.

Returning again to FIG. 14E, at step 402, if the value tested BAD, then the process continues at step 412. At step 412, the next output position is updated. The process then continues with steps 406 and 408 as discussed above.

In the above discussion with respect to FIGS. 14A–14E, a decoding of fault-tolerant coded devices of a memory array have been discussed in detail. Such decoding is carried out via controller 54 of analog flash memory array 50. Coding of analog flash memory array 50 with the fault tolerant code as discussed herein is also carried out via controller 54. Programming of controller 54 for coding and decoding as described herein can be done using programming techniques known in the art and thus only briefly discussed herein. For instance, programming for the fault-tolerant coding of devices is qualitatively the inverse of the decoding process and not further described herein.

As discussed, the present fault-tolerant coding method and apparatus advantageously handle simple to complex fault situations. For the memory fault statistics of any particular multi-level sequential memory device, there is a suitable efficient code (e.g., a least expensive code) to handle the corresponding memory fault statistic. Preferably, the most suitable fault tolerant code is chosen in conjunction with the memory fault statistic of the particular multi-level sequential memory device.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims.

What is claimed is:

1. A fault-tolerant code semiconductor memory storage device comprising:

an array of individual multi-level storage devices arranged in a prescribed sequence, wherein said array of individual multi-level storage devices includes n-bit storage devices, where n is an integer, the storage devices for storing $2^n$ data levels and further having at least one additional level, the additional level for use in coding an occurrence of a faulty device as detected by said control means, and control means for programming said array with sequential data, said control means further for detecting an occurrence of a faulty storage device in said array during a programming of said array with the sequential data, said control means further for coding the occurrence of the faulty storage device in a subsequent storage device in the sequence of devices using a fault-tolerant code.

2. The device of claim 1, wherein said control means further includes means for de-coding the fault-tolerant code during a sequential read out of data from said array to thereby circumvent a fault situation.

3. The device of claim 1, wherein said sequential array of individual multi-level storage devices includes floating gate MOSFET devices.

4. The device of claim 1, wherein said control means implements device at-a-time redundancy in said sequential array of multi-level storage devices.

5. The device of claim 1, wherein said control means further uses a single storage device occurring immediately subsequent to a faulty device in the sequence of storage devices for coding that a previous device was determined faulty by said control means.

6. The device of claim 1, wherein said control means codes for simple, compound, and complex fault situations using at least one storage device in the sequence of storage devices which occurs subsequent to an at least one storage device determined to be faulty by said control means in accordance with respective simple, compound, and complex fault situations.

7. The device of claim 1, wherein data stored in a subsequent storage device of the sequence of storage devices is used for signaling the occurrence of a faulty device when a previous device in the sequence of storage devices is determined to be faulty by said control means.

8. The device of claim 1, wherein during a sequential read out of data from said memory array, said control means operates to substitute data contained in a device occurring subsequent to a fault tolerant coded device for data of a faulty device identified by the fault tolerant coded device.

9. The device of claim 1, wherein said control means implements the fault-tolerant coding of faulty devices in said array each time said array is programmed with data.

10. The device of claim 1, wherein a faulty device is characterized by an inability of the device to be programmed to a prescribed data value as required during programing of a sequence of values in said array.

11. The device of claim 1, wherein the storage devices of said array include 2-bit memory devices, further wherein a probability of three (3) sequential faults in said array is equal to zero.

12. The device of claim 1, further wherein a simple fault includes a single faulty device in a sequence of m storage devices, where m is an integer greater than 0, of the sequence of storage devices in said array, a compound fault includes two adjacent faulty devices in a sequence of m storage devices of the sequence of storage devices in said array, and a complex fault includes two faulty devices occurring close together but not abutting in a sequence of m storage devices of the sequence of storage devices in said array.

13. The device of claim 12, wherein a sequence of m fault tolerant codes followed by m non-fault tolerant codes is used to indicate that a particular fault situation in the sequence of storage devices of said array has been resolved.

14. The device of claim 13, further wherein at least one storage device occurring in between a sequence of m fault tolerant coded devices and a sequence of m non-fault tolerant coded devices is used for storing data corresponding to a data pointer, wherein the data pointer provides an indication to said control means of how far back in the sequence of storage devices said control means must go to be at the beginning of a corresponding fault situation.

15. The device of claim 1, wherein said control means temporarily stores a prescribed amount of data read from the sequence of storage devices until an occurrence and detection of a stop code by said control means, the stop code indicating that a prescribed amount of data read from the sequence of data of said array is good data.

16. A method of fault-tolerant coding of a semiconductor memory storage device, said method comprising the steps of:
providing an array of individual multi-level storage devices arranged in a prescribed sequence;
programming said array with sequential data;
detecting an occurrence of a faulty storage device in the array during a programming of the array with the sequential data; and
coding the occurrence of the faulty storage device in a subsequent storage device in the sequence of devices using a fault-tolerant code, said array of individual multi-level storage devices includes n-bit storage devices, where n is an integer, the storage devices for storing $2^n$ data levels and further having at least one additional level, the additional level for use in coding an occurrence of a faulty device as detected by said detecting step.

17. The method of claim 16, further including the step of:
de-coding the fault-tolerant code during a sequential read out of data from the array to thereby circumvent a fault situation.

18. The method of claim 16, wherein the sequential array of individual multi-level storage devices includes floating gate MOSFET devices.

19. The method of claim 16, wherein said coding step includes implementing device at-a-time redundancy in the sequential array of multi-level storage devices.

20. The method of claim 16, wherein said coding step includes using a single storage device occurring immediately subsequent to a faulty device in the sequence of storage devices for coding that a previous device was determined faulty by said detecting step.

21. The method of claim 16, wherein said coding step codes for simple, compound, and complex fault situations using at least one storage device in the sequence of storage devices which occurs subsequent to an at least one storage device determined to be faulty by said detecting step in accordance with respective simple, compound, and complex fault situations.

22. The method of claim 16, wherein data stored in a subsequent storage device of the sequence of storage devices is used for signaling the occurrence of a faulty device when a previous device in the sequence of storage devices is determined to be faulty by said detecting step.

23. The method of claim 16, further including the step of:
sequentially reading out data from the memory array and substituting data contained in a device occurring subsequent to a fault tolerant coded device for data of a faulty device identified by the fault tolerant coded device.

24. The method of claim 16, wherein said coding step implements the fault-tolerant coding of faulty devices in the array each time the array is programmed with data.

25. The method of claim 16, wherein a faulty device is characterized by an inability of the device to be programmed to a prescribed data value as required during programing of a sequence of values in the array.

26. The method of claim 16, wherein the storage devices of the array include 2-bit memory devices, further wherein a probability of three (3) sequential faults in the array is equal to zero.

27. The method of claim 16, wherein a simple fault includes a single faulty device in a sequence of m storage devices, where m is an integer greater than 0, of the sequence of storage devices in the array, a compound fault includes two adjacent faulty devices in a sequence of m storage devices of the sequence of storage devices in the array, and a complex fault includes two faulty devices occurring close together but not abutting in a sequence of m storage devices of the sequence of storage devices in the array.

28. The method of claim 27, wherein a sequence of m fault tolerant codes followed by m non-fault tolerant codes is used to indicate that a particular fault situation in the sequence of storage devices of the array has been resolved.

29. The method of claim 28, further wherein at least one storage device occurring in between a sequence of m fault tolerant coded devices and a sequence of m non-fault tolerant coded devices is used for storing data corresponding to a data pointer, wherein the data pointer provides an indication of how far back in the sequence of storage devices to go to be at the beginning of a corresponding fault situation.

30. The method of claim 16, further comprising the step of:
temporarily storing a prescribed amount of data read from the sequence of storage devices until an occurrence and detection of a stop code, the stop code indicating that a prescribed amount of data read from the sequence of data of the array is good data.

* * * * *

UNITED STATES PATENT AND TRADEMARK OFFICE
CERTIFICATE OF CORRECTION

PATENT NO.    : 6,182,239 B1
DATED         : January 30, 2001
INVENTOR(S)   : Alan Kramer It is certified that error appears in the above-identified patent and that said Letters Patent is hereby corrected as shown below:

Column 9,
Line 25, replace "SIMPLE CCWD FAULT" with -- SIMPLE COMPOUND FAULT --

Column 16,
Line 21, replace "prescribed sequence," with -- prescribed sequence; --

Signed and Sealed this

First Day of July, 2003

JAMES E. ROGAN
*Director of the United States Patent and Trademark Office*